United States Patent [19]
Inoue

[11] Patent Number: 5,685,232
[45] Date of Patent: Nov. 11, 1997

[54] POSITIONING STAGE DEVICE EXPOSURE APPARATUS AND DEVICE MANUFACTURING METHOD UTILIZING THE SAME

[75] Inventor: Mitsuru Inoue, Utsunomiya, Japan

[73] Assignee: Canon Kabushiki Kaisha, Tokyo, Japan

[21] Appl. No.: 744,276

[22] Filed: Nov. 6, 1996

Related U.S. Application Data

[63] Continuation of Ser. No. 334,731, Oct. 18, 1994, abandoned.

[30] Foreign Application Priority Data

Oct. 19, 1993 [JP] Japan ................. 5-284437

[51] Int. Cl.$^6$ ..................................... A47B 85/00
[52] U.S. Cl. ............................... 108/20; 108/22
[58] Field of Search .................. 108/20, 21, 22; 74/813 L, 16, 826

[56] References Cited

U.S. PATENT DOCUMENTS

| | | | |
|---|---|---|---|
| 3,155,383 | 11/1964 | Whitmore | 108/20 X |
| 3,393,648 | 7/1968 | Diehr | 108/20 |
| 4,656,951 | 4/1987 | Kimura et al. | 108/20 |
| 5,040,431 | 8/1991 | Sakino et al. | |
| 5,163,651 | 11/1992 | Matsumoto | 108/20 X |
| 5,170,678 | 12/1992 | Wawrzyniak et al. | 74/813 L |
| 5,239,892 | 8/1993 | Sakai | 74/813 L |
| 5,320,047 | 6/1994 | Deurloo et al. | 108/20 |

*Primary Examiner*—José V. Chen
*Attorney, Agent, or Firm*—Fitzpatrick, Cella, Harper & Scinto

[57] ABSTRACT

A positioning stage device capable of regulating in a wide range the rotational angle of a Z-stage supporting a suction chuck. The suction chuck is constructed integrally with the Z-stage, which is supported by a bearing so as to be movable along the Z-axis and rotatable about the Z-axis. A rotation stopper plate integral with the Z-stage is supported on both faces by bearing pads of an air bearing supported by a rotary ring, and is rotated about the Z-axis together with the air bearing by means of a motor, whereby the rotational angel of the Z-stage is regulated.

7 Claims, 6 Drawing Sheets

POSITIONING STAGE DEVICE EXPOSURE APPARATUS AND DEVICE MANUFACTURING METHOD UTILIZING THE SAME

This application is a continuation of application Ser. No. 08/334,731 filed Oct.18, 1994, now abandoned.

BACKGROUND OF THE INVENTION

1. Field of the Invention

The present invention relates to a positioning stage device for positioning a substrate such as wafer, an article to be worked on or to be measured, for example in a semiconductor exposure apparatus, various precision working apparatus or measuring apparatus.

2. Related Background Art

Figure 6:
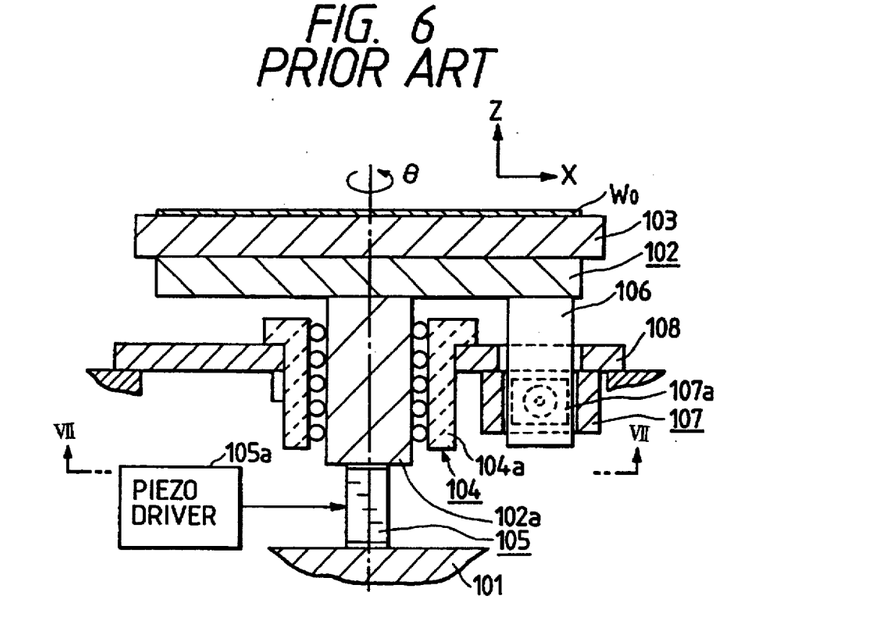
FIG. 6 is a schematic cross-sectional view of a conventional device.
Figure 7:
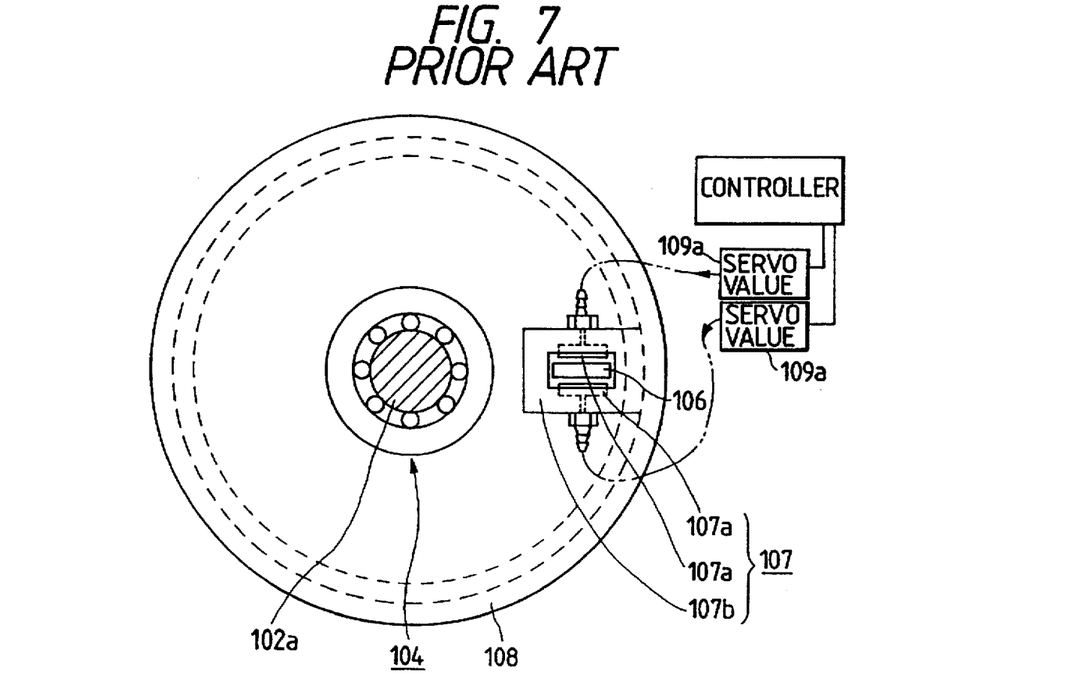
FIG. 7 is a bottom plan view of the device shown in FIG. 6, seen from a line VII—VII therein.

In a semiconductor exposure apparatus, and various precision working or measuring apparatus, it is necessary to position a substrate, such as a wafer to be exposed or an article to be worked on or measured with a high precision, by means of jigs or instruments. For this purpose, there has been developed a positioning stage device as shown in FIGS. 6 and 7. This device is provided with a Z-stage 102 supported movably in the vertical direction (hereinafter called the Z-direction) above a top plate 101 of an XY-stage having an XY-driving mechanism, a suction chuck 103 supported by the Z-stage 102, a bearing 104 supporting a shaft 102a integral with the Z-stage 102 so as to enable reciprocating motion in the Z-direction and rotating motion thereabout, a piezoelectric driving device 105 integral with the shaft 102a and serving to move the shaft 102a in the Z-direction, a rotation stopper plate 106 integral with the Z-stage 102, and a static pressure bearing 107 having a pair of bearing pads 107a each opposed to each face of the rotation stopper plate 106. A housing 104a of the bearing 104 and a housing 107b of the static pressure bearing 107 are both fixed to a disk-shaped support member 108 integral with the top plate 101 of the XY-stage. The Z-stage 102 is moved reciprocatively in the Z-direction via the piezoelectric driving device 105 which expands and contracts in the Z-direction, under the control of a piezoelectric driver 105a. The rotational angle θ of the Z-stage about the Z-axis is finely adjustable within the gap of the static pressure bearing 107 by the control of the air pressure supplied to the bearing pads 107a through servo valves 109a.

In case of a semiconductor exposure apparatus, a wafer $W_0$ is attached by suction to the suction chuck 103, and the Z-stage 102 is moved in the Z-direction by the piezoelectric driving device 105 to effect focusing of the wafer $W_0$ relative to an alignment optical system (not shown) or the like. The positional deviation of the wafer $W_0$ with respect to a mask or the like is detected by the alignment optical system, and each servo valve 109a is controlled to adjust the air pressure of each bearing pad 107a, whereby the rotational angle θ of the wafer $W_0$ about the Z-axis is finely regulated.

In such conventional technology, however, the fine adjustment of the rotational angle θ of the Z-stage is only possible within the gap of the static pressure bearing as explained above. If a positional deviation exceeding the dimension of the gap is detected, there are required countermeasures such as the repeated transfer of the wafer or the rotation of the top plate of the XY-stage. As a result, there may a complication of the semiconductor device manufacturing process or the dimension of the positioning stage device may need to be increased.

SUMMARY OF THE INVENTION

In consideration of the above-explained drawback of the prior technology, the object of the present invention is to provide a positioning stage device capable of adjusting the rotational angle of the Z-stage beyond the gap dimension of the static pressure bearing, and an exposure apparatus and a device manufacturing method utilizing such a positioning stage device.

The above-mentioned object can be attained, according to a preferred embodiment of the present invention, by a positioning stage device comprising a stage rotatable about an axis, a rotation stopper member provided integrally with the stage, restraint means for restraining the rotation of the rotation stopper member about the axis, and drive means for rotating the restraint means about the axis.

According to the construction mentioned above, the rotational angle of the stage can be adjusted in a wide range by the rotation of the restraint means. The fine adjustment of the rotational angle is made easy when the restraint means is composed of a static pressure bearing.

Other objects of the present invention, and the features thereof, will become fully apparent from the following description of the embodiments.

DETAILED DESCRIPTION OF THE PREFERRED EMBODIMENTS

Figure 1:
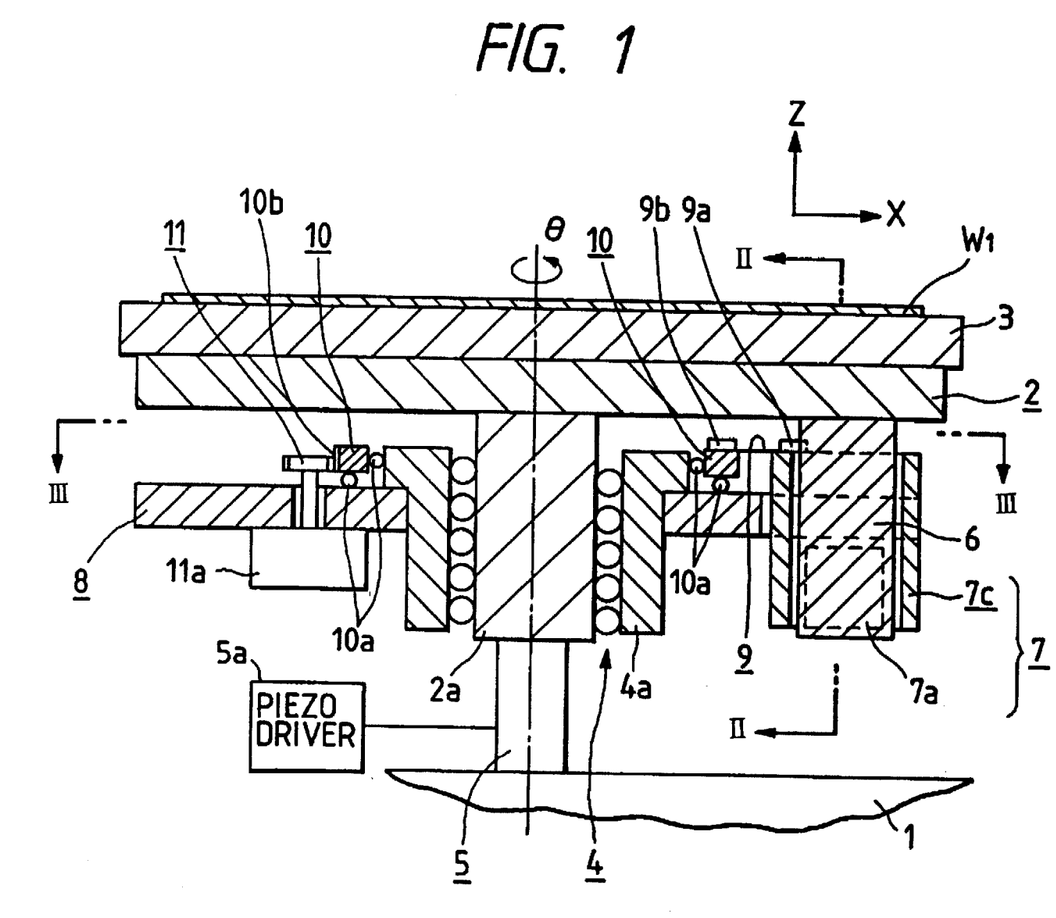
FIG. 1 is a schematic cross-sectional view of an embodiment of the present invention.

FIG. 1 is a schematic cross-sectional view of an embodiment of the positioning stage device according to the present invention. The device is provided with a Z-stage 2 which is a supporting plate supported, movably in the vertical direction (hereinafter called the Z-direction), by a guide device (not shown) on a top plate 1 constituting a top plate of an XY-stage of a semiconductor exposure apparatus, a suction chuck 3 supported by the Z-stage 2, a bearing 4 for supporting a shaft 2a integral with the Z-stage 2 in such a manner as to allow reciprocating motion in the Z-direction and rotating motion about the Z-axis, a piezoelectric driving device 5 provided integrally within the shaft 2a and adapted for moving the shaft 2a in the Z-direction, a piezoelectric driver 5a for controlling the piezoelectric driving device 5, a rotation stopper plate 6 constituting a rotation stopper member integral with the Z-stage 2, and an air bearing 7 provided with a pair of static pressure bearing pads 7a. The pads 7a have support faces 7b (see FIG. 2) respectively opposed to both faces of the rotation stopper plate 6, thereby restraining the rotation stopper plate 6 in non-contact state. As a result, pads 7a constitute restrains means for restraining rotation of the rotation stopper plate 6. A housing 4a of the bearing 4 is fixed to a disk-shaped support member 8 integral with the above-mentioned top plate 1.

Figure 2:
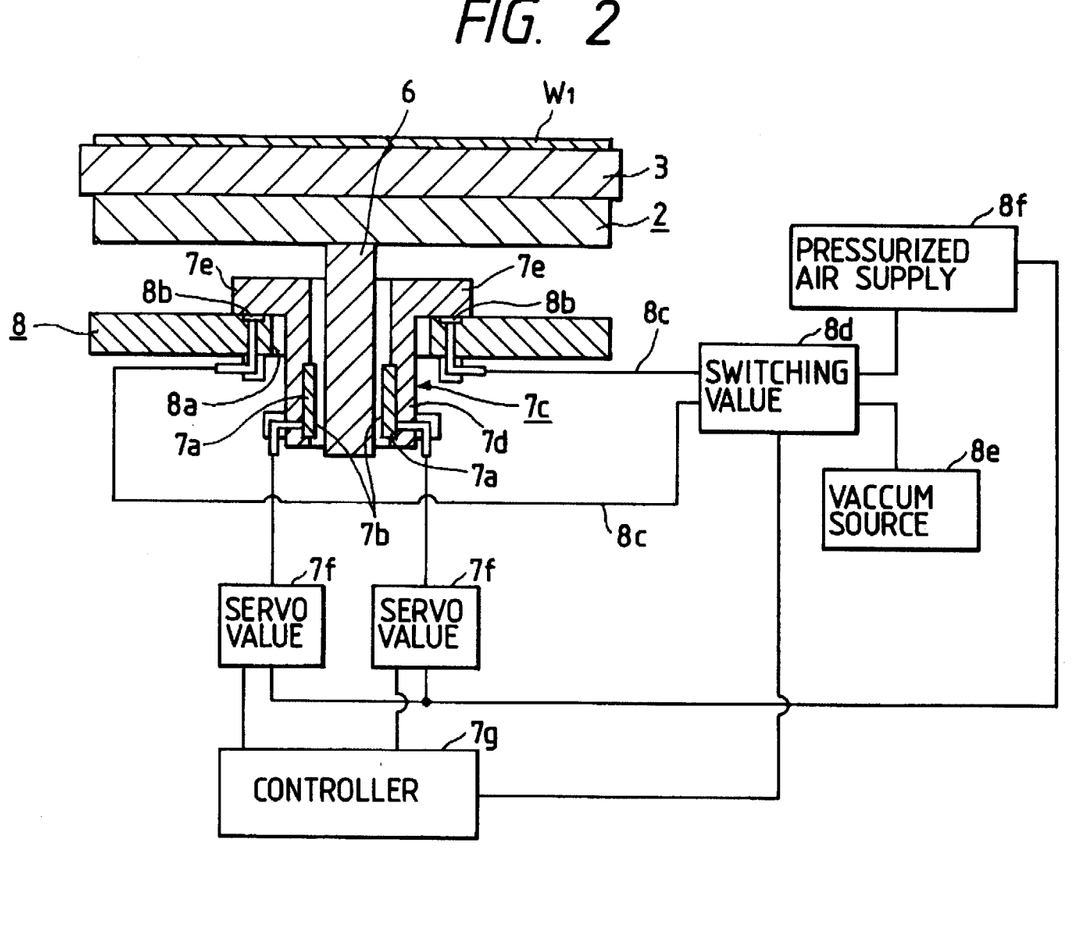
FIG. 2 is a schematic cross-sectional view, along a line II—II of the device shown in FIG. 1.

As shown in FIG. 2, a housing 7c of the air bearing 7 is provided with a cylindrical main body 7d and a pair of protruding pieces 7e formed integrally at the upper end of the cylindrical main body. The main body 7d penetrates a notch 8a provided in the support member 8. The dimension of the notch 8a is set larger than the external dimension of the main body 7d of the housing 7c of the air bearing 7, so as not to hinder the housing 7c of the air bearing 7 from moving when it is moved by a predetermined amount by a rotary driving device, which constitutes drive means to be explained later. The protruding pieces 7e are adhered to the upper face of the support member 8, by a vacuum suction force generated in suction grooves 8b formed on the upper face of the support member 8 and constituting locking means. An internal pipeline 8c connected to the suction grooves 8b is connected to a switching valve 8d and can be connected by the valve 8d to either a vacuum source 8e or a pressurized air source 8f. Thus, when a vacuum suction force is generated in the suction grooves 8d, the housing 7c of the air bearing 7 is integrally attached by suction to the upper face of the support member 8. When the pressurized air is supplied to the suction grooves 8, the protruding pieces 7e of the housing 7c of the air bearing 7 float from the upper face of the support member 8, whereby the housing 7c becomes rotatable with respect to the support member 8 within the dimensional margin of the notch 8a.

The wafer $W_1$ attached to the suction chuck 3 can be focused to an alignment optical system (not shown) by the movement of the Z-stage 2 in the Z-direction by means of the piezoelectric driving device 5. Then the positional deviation of the wafer with respect to a mask or the like is detected by the alignment optical system. Based on the thus detected positional deviation, the housing 7c of the air bearing 7 is moved, and the rotational angle θ of the Z-stage about the Z-axis is regulated by means of the rotation stopper plate 6, thereby eliminating the rotation positional deviation of the wafer $W_1$.

The bearing pads 7a of the air bearing 7 are connected to servo valves 7f. The servo valves 7f are controlled by the controller 7g, whereby the pressure of pressurized air emitted from the bearing pads 7a toward the faces of the rotation stopper plate 6 is regulated to finely adjust the rotation angle θ of the rotation stopper plate 6 or the Z-stage 2 within the gap of the air bearing 7.

In the following there will be explained the rotary driving device for moving the housing 7c of the air bearing 7 relative to the support member 8.

Figure 3:
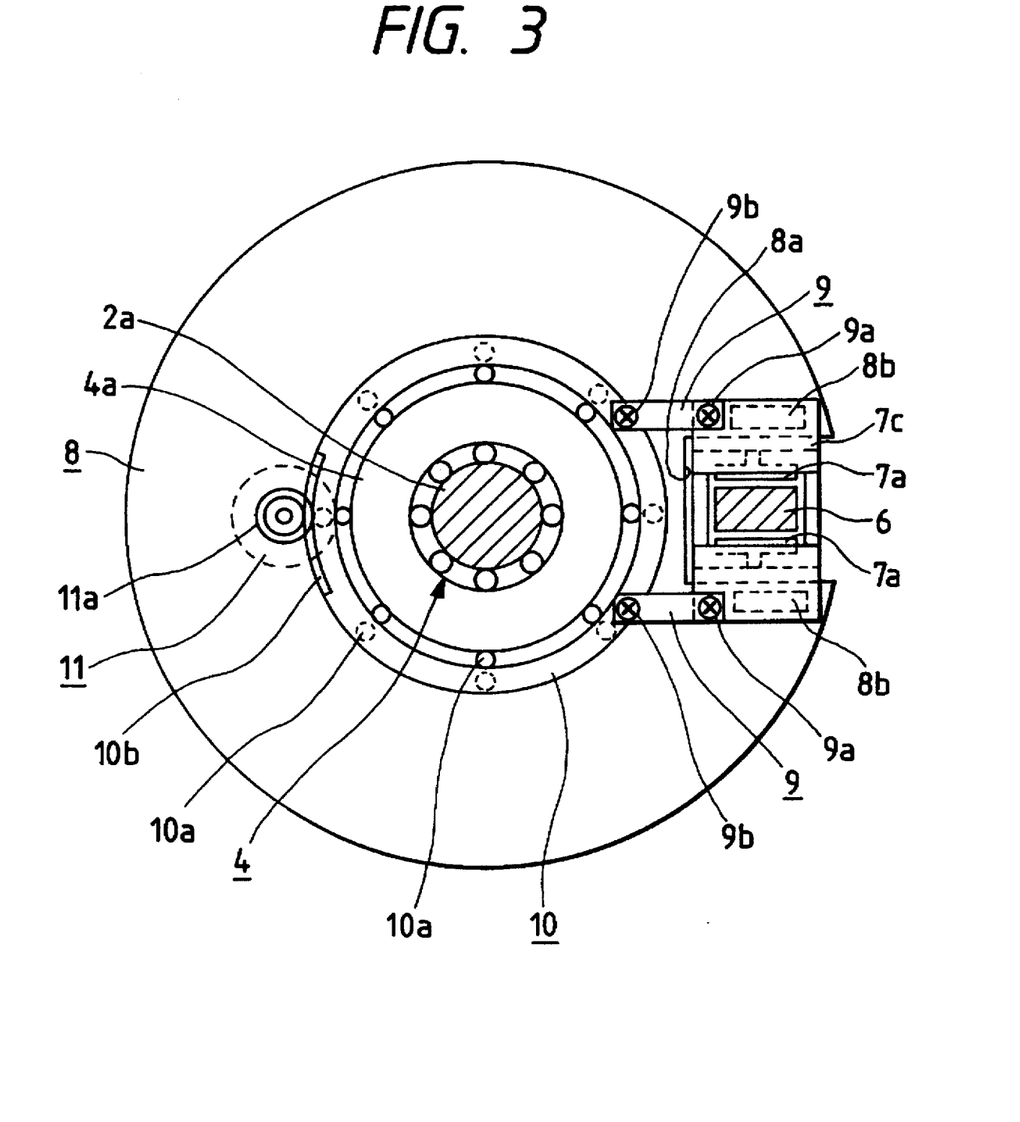
FIG. 3 is a plan view of the device shown in FIG. 1, seen from a line III—III thereof.

As shown in FIG. 3, an end of each plate spring 9 which is an elastic member, is fixed with a screw 9a to each protruding piece 7e of the housing 7c of the air bearing 7, while the other end of the plate spring 9 is fixed with a screw 9b to a rotary ring 10. Each plate spring 9 is so constructed that it is easily deformable only in the Z-direction thereby not hindering the movement of the protruding pieces 7e of the housing 7c of the air bearing 7 when the pieces 7e float from the support member 8, and so that it has high rigidity in directions perpendicular to the Z-direction. The rotary ring 10 is supported on the upper face of the support member 8 and around the housing 4a of the bearing 4 via steel balls 10a, and is therefore rendered rotatable about the housing 4a. On a part of the external periphery of the rotary ring 10 there is provided a segment gear 10b, which mates with a gear 11 driven by a motor 11a. Upon activating the motor 11a when the protruding pieces 7e of the housing 7c of the air bearing 7 float from the upper face of the support member 8 as explained above, the rotary ring 10 is rotated by the gear 11, whereby the housing 7c of the air bearing 7 moves together with both plate springs 9 in the circumferential direction of the support member 8. As the housing 7c of the air bearing 7 moves, the rotation stopper plate 6 moves in the circumferential direction of the Z-stage 2, whereby the Z-stage 2 is rotated.

According to the present embodiment in which the air bearing is moved by the motor thereby rotating the Z-stage through the rotation stopper plate, the rotational angle θ of the Z-stage can be regulated in a much wider range in comparison with the conventional structure in which the rotational angle θ of the Z-stage is only regulated by the variation in the pressure of pressurized air supplied to the air bearing. In addition, the fine adjustment of the rotational angle is also possible, as in the conventional structure, by the regulation of pressure of the pressurized air supplied to the air bearing.

As another embodiment, a faster response can be achieved by providing the rotation stopper plate 6 with a permanent magnet and replacing the air bearing 7 by a magnetic bearing employing a coil. Also, the use in vacuum is possible when solenoid attraction is utilized for the locking means.

Next, an embodiment of the present invention which is applied to a semiconductor device manufacturing method utilizing an exposure apparatus according to one of the preceding embodiments, will now be explained.

Figure 4:
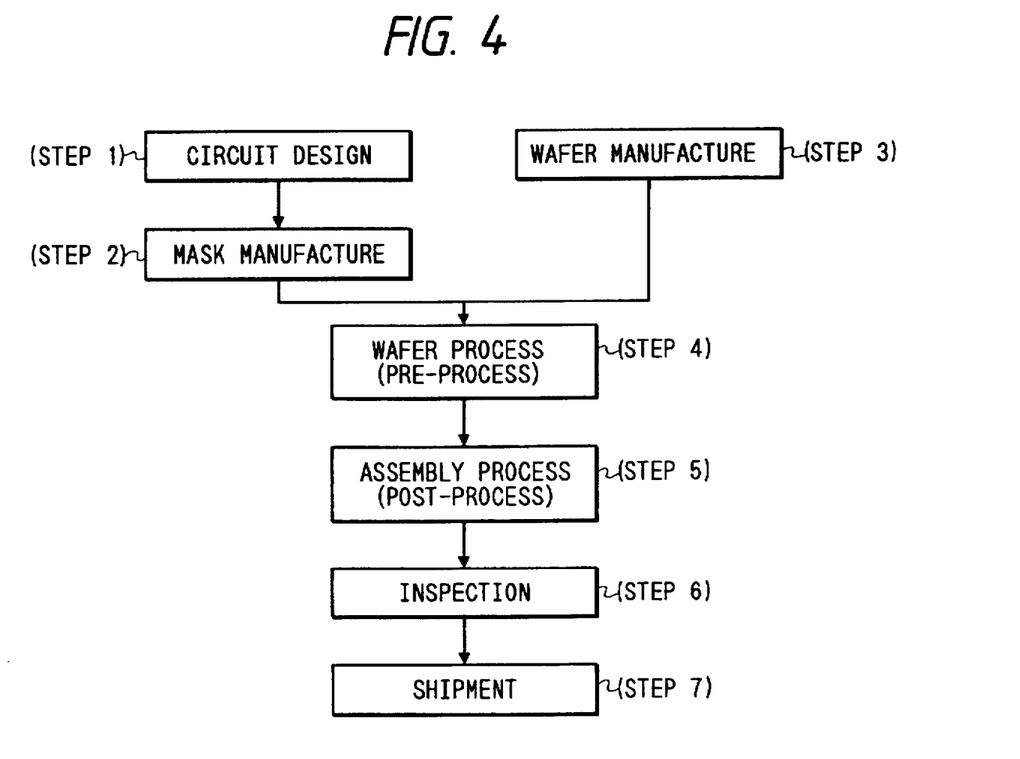
FIG. 4 is a flow chart showing the manufacturing process of manufacturing a semiconductor device.

FIG. 4 is a flow chart of the sequence of manufacturing steps of a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 5:
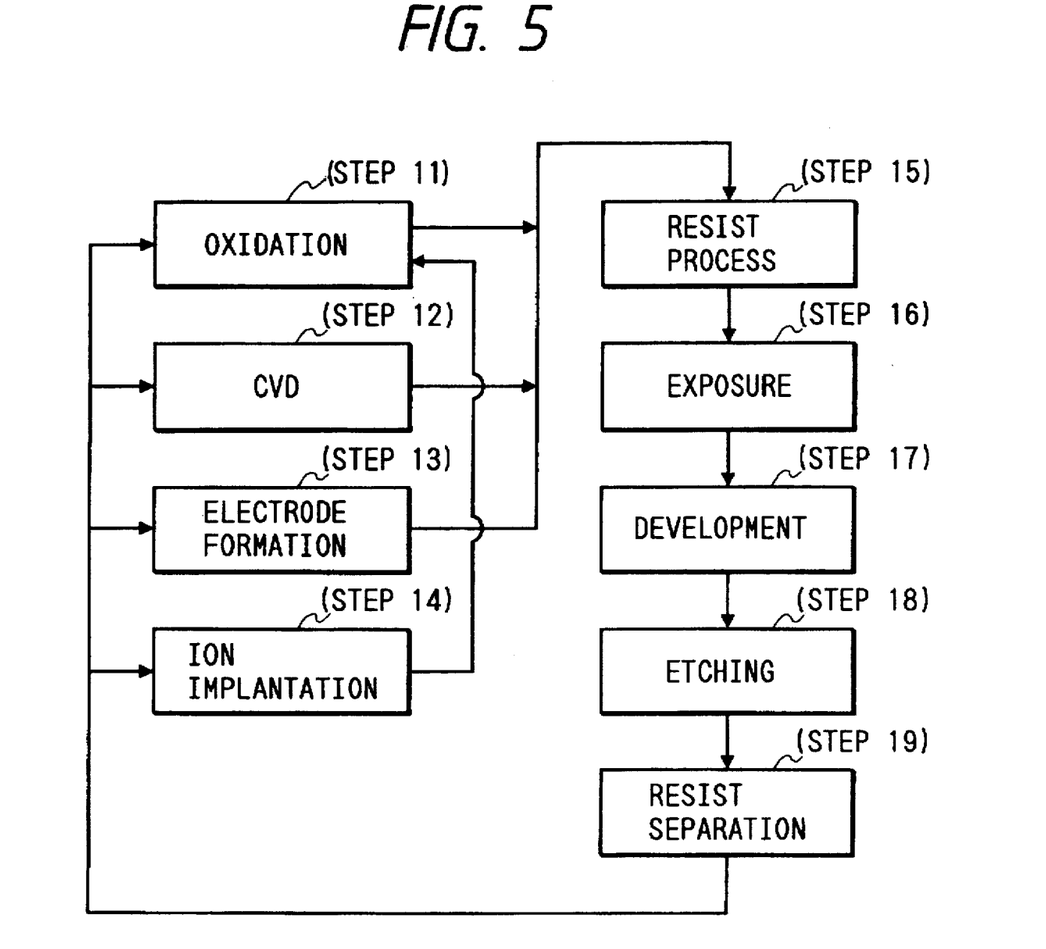
FIG. 5 is a flow chart showing the detailed steps of a wafer process.

FIG. 5 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A positioning stage device comprising:

a stage rotatable about an axis;

a rotation stopper member rotatable integrally with said stage;

restraint means, including a bearing, for restraining rotation of said rotation stopper member about said axis within a predetermined minute range; and drive means for rotating said restraint means about said axis in a range wider than said predetermined minute range, whereby said stage is roughly positioned by the rotation of said restraint means by said drive means, and then positioned finely within the predetermined minute range defined by said restraint means.

2. A device according to claim 1, further comprising an actuator for moving said stage along a direction of said axis.

3. A device according to claim 1, wherein said restraint means includes air bearings disposed, to be spaced so as to sandwich said rotation stopper member with respect to the rotation direction.

4. A device according to claim 3, wherein pressurized air of each of said air bearings are adjusted independently, whereby the stage is finely positioned.

5. A device according to claim 1, further comprising locking means for locking said restraint means to a fixed support member by an attraction force.

6. A positioning stage device according to claim 1, wherein said restraint means is connected to said drive means through an elastic member, said elastic member being capable of deforming in a direction of the axis.

7. A positioning stage device according to claim 1, wherein said stage is adapted to support a wafer to be exposed.

* * * * *

UNITED STATES PATENT AND TRADEMARK OFFICE
CERTIFICATE OF CORRECTION

PATENT NO. : 5,685,232
DATED : November 11, 1997
INVENTOR(S) : Mitsuru INOUE

It is certified that error appears in the above-identified patent and that said Letters Patent is hereby corrected as shown below:

On the cover page:

Item [57], Abstract:

Line 9, "angel" should read --angle--.

Column 1:

Line 64, "may" should read --may result--.

Column 2:

Line 63, "7ahave" should read --7a have--.
    Line 66, "restrains" should read --restrain--.

Signed and Sealed this

Twenty-first Day of July, 1998

Attest:

BRUCE LEHMAN

Attesting Officer     Commissioner of Patents and Trademarks